United States Patent
Livengood et al.

(10) Patent No.: US 6,355,950 B1
(45) Date of Patent: *Mar. 12, 2002

(54) SUBSTRATE INTERCONNECT FOR POWER DISTRIBUTION ON INTEGRATED CIRCUITS

(75) Inventors: Richard H. Livengood, Los Gatos; Paul Winer, Santa Clara; Valuri R. M. Rao, Saratoga, all of CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,318

(22) Filed: Sep. 23, 1998

(51) Int. Cl.[7] .......................... H01L 29/80; H01L 31/112

(52) U.S. Cl. ........................................ 257/276; 257/508

(58) Field of Search ..................... 257/276, 659, 257/508, 691, 698, 382, 618, 207, 621, 758; 438/620, 214

(56) References Cited

U.S. PATENT DOCUMENTS

| | | | | |
|---|---|---|---|---|
| 4,505,799 A | * | 3/1985 | Baxter | 204/416 |
| 5,352,998 A | * | 10/1994 | Tanino | 257/691 |
| 5,565,697 A | * | 10/1996 | Asakawa et al. | 257/520 |
| 5,726,485 A | * | 3/1998 | Grass | 257/532 |
| 5,825,080 A | * | 10/1998 | Imaoka et al. | 257/659 |
| 5,942,784 A | * | 8/1999 | Harima et al. | 257/372 |

* cited by examiner

*Primary Examiner*—Phat Xuan Cao
(74) *Attorney, Agent, or Firm*—Blakely, Sokoloff, Taylor & Zafman LLP (57) ABSTRACT

A backside interconnect structure is used to deliver power through the substrate to the front side of an integrated circuit. One or more power planes are formed on the backside of the substrate and coupled to power nodes on the front side by deep vias in the substrate. In a specific embodiment of the invention, power planes are coupled through the substrate to front side metal lines, well taps and external connection points. Placing power planes on the opposite side of the substrate from the signal interconnects allows the use of low dielectric constant materials between signal lines, while using high dielectric constant materials between power planes thus increasing decoupling capacitance without increasing parasitic capacitance between signal lines.

27 Claims, 5 Drawing Sheets

SUBSTRATE INTERCONNECT FOR POWER DISTRIBUTION ON INTEGRATED CIRCUITS

BACKGROUND OF THE INVENTION

1. Field of the Invention

The invention relates generally to integrated circuit manufacturing, and more particularly to interconnection structures that include the substrate of an integrated circuit and methods for making the same.

2. Background

Advances in semiconductor process technology and digital system architecture have led to integrated circuits having increased operating frequencies. Higher operating frequencies typically result in undesirable increases in power consumption. Power consumption is a significant problem for integrated circuits (ICs) generally, and particularly for large scale, complex, high speed products such as processors and microprocessors.

Nonetheless, the trend of integrating more functions on a single chip, while operating at ever higher frequencies goes on unabated.

One well-known way to reduce power consumption is by reducing the power supply voltage used by integrated circuits. Unfortunately, reduced operating voltages result in design constraints with respect to noise margin, and require greater care, and typically more area, in the layout of power distribution lines. More area is typically required for widening of the power distribution lines in order to reduce resistance and thus reduce undesirable voltage drops.

What is needed is an interconnect structure for integrated circuits that reduces the noise margin and voltage drop constraints commonly found in integrated circuits having low power supply voltages. What is further needed is a method of manufacturing such a structure.

SUMMARY OF THE INVENTION

Briefly, a backside interconnect structure is used to deliver power through the substrate to the front side of an integrated circuit.

In a specific embodiment of the present invention, power planes are formed on the back side of a substrate, and a series of deep vias through the substrate are used to couple the power planes to front side metal lines, and to well taps.

DETAILED DESCRIPTION

Illustrative embodiments of the present invention are described below. In the interest of clarity, not all details of an actual implementation are described in this specification. It will of course be appreciated that in the development of any such actual embodiment, numerous implementation-specific decisions must be made to achieve the developer's specific goals, such as compliance with manufacturing equipment tolerances, and other process integration constraints, which will vary from one implementation to another. Moreover, it will be appreciated that such a development effort might be complex and time-consuming, but would nevertheless be a routine undertaking for those of ordinary skill in the art having the benefit of this disclosure.

Conventionally, the power distribution of an integrated circuit is accomplished by a pattern of metal lines disposed on layers of insulating material, with vias, or contacts, electrically connecting these metal lines with the various active and passive components of the integrated circuit. Together, these lines and interconnecting vias are disposed upon the transistor side, that is, the front side of an integrated circuit.

Power distribution in integrated circuits has typically been an important design consideration. As ICs have increased in physical dimension and power consumption, power distribution considerations have become even more important. Proper power distribution has become critical to successfully producing large, high-performance products including but not limited to processors and microprocessors. As the power supply voltage level of an IC is lowered, an increasing proportion of the available routing resources are reserved for Vcc and Vss routing so as to provide power distribution with the required attributes of low noise and low voltage drop (i.e., IR drop). It has been found that about 20% to 30% of the available routing resources are required for power distribution for high performance microprocessors.

ICs in accordance with the present invention use the backside of the IC to distribute power. A plurality of deep vias are formed through the substrate to connect power supply nodes to the first layer of metal on the front side and/or to connect power supply nodes to wells, such as n-wells or p-wells.

It is possible to use substantially all of the backside surface of the IC for the power distribution interconnect system. This results in lower IR drop, and lower inductance, than is possible with front side only power distribution. Lower IR drop and lower inductance provide improved operating voltage margin to the designer which in turn can be used to produce higher speed circuits.

Additionally, forming power planes on the back side effectively creates a large decoupling capacitance that consequently provides improved operating voltage margin. The backside power planes are separated by a dielectric layer. The material comprising the dielectric layer separating the power planes, as well as the thickness of this dielectric material, can be chosen to provide a desired capacitance per unit area. For the power planes, it is generally desirable to have a higher capacitance per unit area than the capacitance per unit area associated with interconnect used for signal routing. Isolating the power planes on the opposite side of the substrate from the signal interconnect, allows the selection of dielectric material for insulating signal interconnects that is different from the material selected to insulate the power planes. In this way, low-k dielectric materials can be used to reduce parasitic capacitance between signal lines, while silicon dioxide or higher dielectric constant materials can be used to increase decoupling capacitance.

In a further aspect of the present invention, well taps are formed in the bottom portion of the wells to interface with substrate vias.

Terminology

The terms, chip, die, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or alloys of Al and Cu, are conductors that provide power distribution and signal paths for coupling or interconnecting, electrical circuitry. Conductors other than metal are available in microelectronic devices. Materials such as, but not limited to, doped polysilicon, doped single-crystal silicon (often referred to simply as diffusion, regardless of whether such doping is achieved by thermal diffusion or ion implantation), titanium (Ti), molybdenum (Mo), nickel (Ni), and refractory metal silicides are examples of other conductors.

The expression conductivity type is generally used in this field to refer to the type of dopant that is used to form semiconductor materials. For example, a electron donor type of dopant is referred to as n-type dopant. Arsenic and phosphorous are examples of n-type dopants. Electron acceptor type of dopants are referred to as p-type dopants. Boron is an example of a p-type dopant.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term substrate-via is used herein to denote a via that provides a pathway at least part way through the substrate. Such a substrate-via may provide a pathway entirely through the substrate. Substrate-vias are typically, but not required to be, vertically oriented.

The expressions, low-k dielectric material, and low dielectric constant material, refer to materials having a lower dielectric constant than oxides of silicon.

Substrate, as used herein, refers to either a whole wafer, or the bulk portion of a diced wafer. A substrate may be a wafer upon which many integrated circuits are formed. Wafers, may be made of semiconducting, non-semiconducting, or combinations of semiconducting and non-semiconducting materials. Wafers, may have thin films of various materials, such as polysilicon, silicon dioxide, polymers or various metals, formed upon them. Other materials such as GaAs, silicon-on-sapphire, or silicon on insulator (SOI) may be used to form wafers. After integrated circuits are formed in the substrate, the substrate is cut into individual integrated circuits, each one commonly referred to as a die. The individual circuit elements and interconnections are typically formed on or near one surface of the substrate. The remaining bulk of the substrate provides mechanical support for the circuits integrated therein.

The term vertical, as used herein, means substantially perpendicular to a surface of a substrate.

Structure

Figure 1:
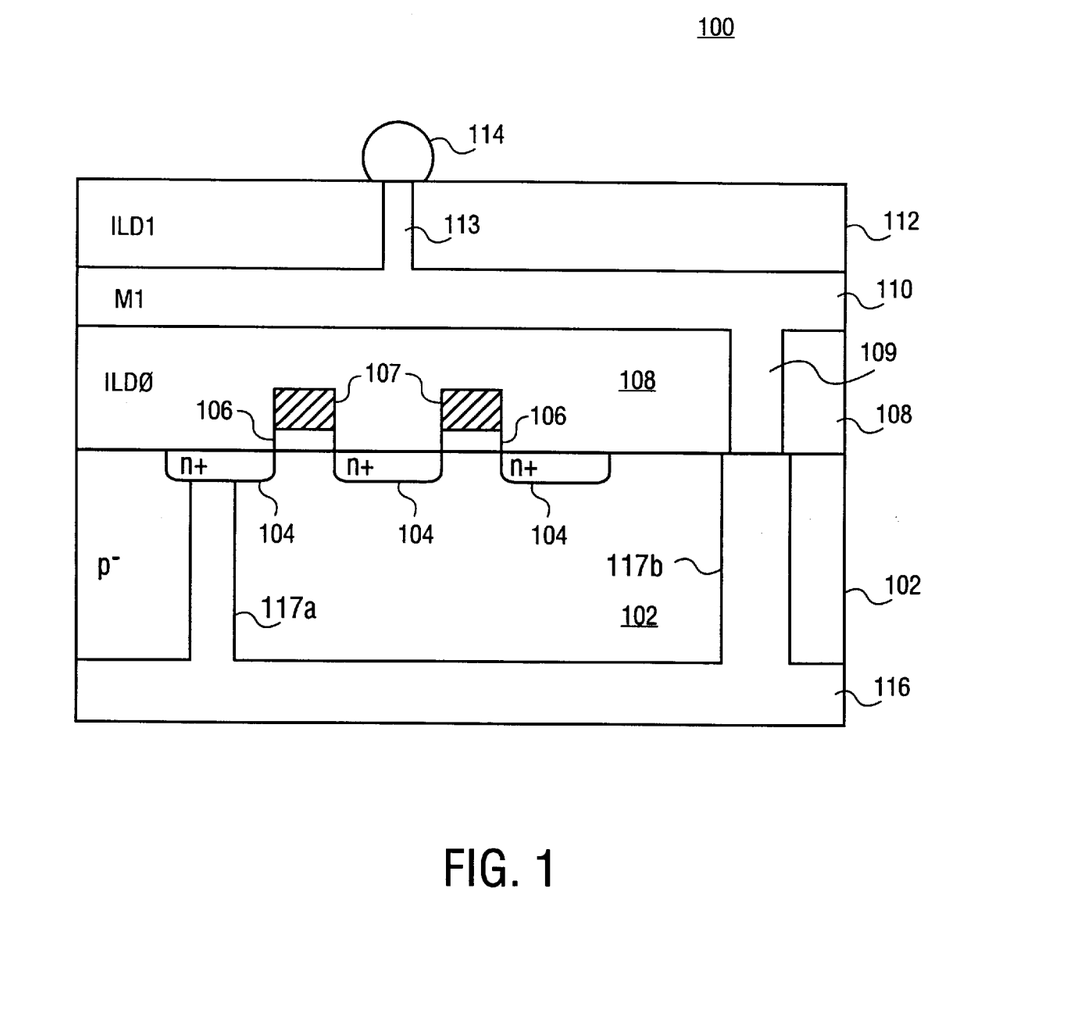
FIG. 1 is a schematic cross-sectional diagram showing a back side power plane, a substrate-via between the power plane and a junction, and a substrate-via between the power plane and a front side interconnect line.

Referring to FIG. 1, a cross-section of an integrated circuit 100 having a power distribution system in accordance with the present invention is shown. As shown in FIG. 1, a power plane is disposed on the backside of the integrated circuit and coupled to junctions and front side interconnect lines through deep vias that are formed in the substrate. These deep vias through the substrate are referred to herein as substrate-vias.

In the illustrative embodiment of FIG. 1, the conductive material of the substrate-vias are not electrically isolated from the substrate. By allowing substrate-vias to make electrical contact with the substrate, appropriate voltages may be applied thereto. For example, an integrated circuit fabricated with n-channel FETs on a p-type substrate could benefit from having the substrate tied to ground. In other embodiments, such as those described more fully below, the substrate-vias are electrically isolated from the substrate.

Still referring to Fig.1, a substrate 102 has a plurality of junctions 104 formed therein. In the illustrative embodiment of the invention shown in FIG. 1, substrate 102 is a p-type silicon wafer and junctions 104 are doped with an n-type dopant such as, but not limited arsenic. Several metal-oxide-semiconductor field effect transistors (referred to as MOSFETs, or more often referred to simply as FETs) are formed in and on substrate 102. As is well known in the art, FETs are active electronic components and include gate, source and drain terminals. In the illustrated embodiment the source and drain terminals are formed by junctions 104 and the gate terminals are formed by the gate electrodes 107 which are disposed upon gate insulators 106. A dielectric layer 108 is disposed upon the surface of substrate 102 as shown in FIG. 1. Dielectric layer 108 is often referred to in the art as an interlayer dielectric (ILD).

As is further shown in FIG. 1, a conductive layer is disposed upon ILD 108 and patterned to form interconnect line 110. The conductive layer is typically a metal such as aluminum or an alloy of aluminum. However those skilled in the art will recognize that many variations of the composition of the conductive layer are possible. For example, the conductive layer may be an alloy of aluminum which includes copper, titanium, or both. A contact 109 is formed through ILD 108 so as to provide an electrically conductive pathway between interconnect line 110 and the surface of substrate 102. A dielectric layer 112 is disposed over interconnect line 110 and that portion of ILD 108 which is not covered by interconnect line 110. A via 113 is formed through dielectric layer 112 so as to provide an electrically conductive pathway between interconnect line 110 and a solder bump 114.

Still referring to FIG. 1, a backside power plane 116 is shown adjacent to the backside of substrate 102. Substrate vias 117a, 117b are formed through substrate 102 so as to provide an electrically conductive pathway between backside power plane 116 and junction 104 and contact 109 as shown.

In the illustrated embodiment, power plane 116 uses solder bump 114 as an external connection point. That is, since the IC makes its connections to the external world by way of the solder bumps arrayed on its front side, power plane 116 may be coupled to the external world through substrate-vias, contacts, interconnect lines, and solder bumps. In alternative embodiments, a backside power plane is electrically coupled to an external power supply directly from the backside.

Figure 2:
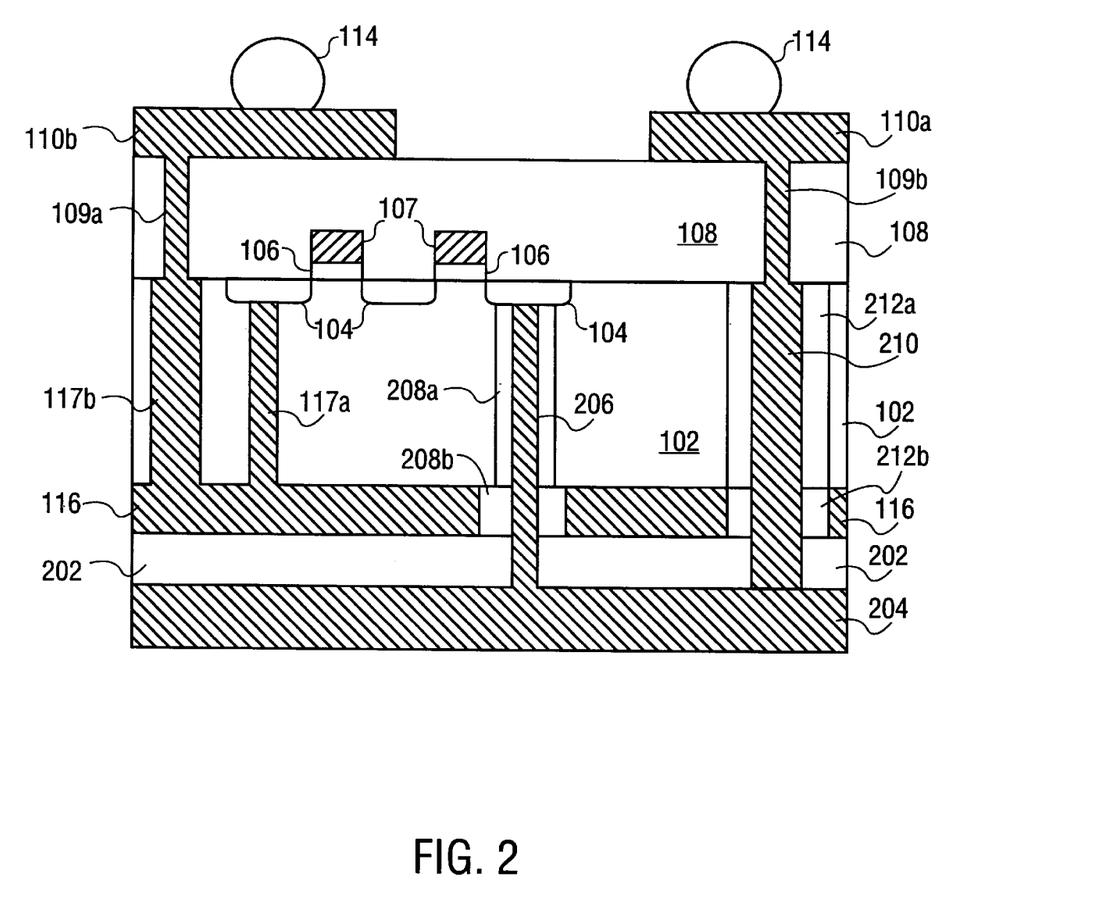
FIG. 2 is a schematic cross-sectional diagram showing a pair of back side power planes separated by a dielectric layer, substrate-vias between each of the power planes and a junction, and substrate-vias between each of the power planes and front side interconnect lines.

FIG. 2 is a schematic cross-sectional view of an integrated circuit 200 similar to that shown in FIG. 1. Integrated circuit 200 includes a pair of power planes, separated by a dielectric layer, and disposed upon the backside of the integrated circuit. The power planes are coupled to junctions and front side interconnect lines through deep vias that are formed in the substrate.

As shown in FIG. 2, a conductive layer is disposed upon ILD 108 and patterned to form interconnect lines 110a, 110b. Contacts 109a, 109b are formed through ILD 108 so as to respectively provide electrically conductive pathways between interconnect lines 110a, 110b and the surface of substrate 102. Solder bumps 114 are schematically represented as disposed upon interconnect lines 110a, 110b. Those skilled in the art will recognize that solder bumps 114 may have different shapes, and may further be isolated to some degree from interconnect lines 110a, 110b by dielectric material. Solder bumps 114 provide one of several known structural alternatives for providing terminals that can be used to connect with components that are external to the integrated circuit.

Still referring to FIG. 2, a pair of power planes 116 and 204 are shown disposed on the backside of substrate 102. Power plane 116 is adjacent substrate 102 and power plane 204 is separated from power plane 116 by a dielectric layer 202. To reduce noise problems in integrated circuit 200, power supply decoupling capacitance is increased in embodiments of the present invention, by forming dielectric layer 202 from a material having a dielectric constant equal to or higher than the dielectric constant of silicon dioxide.

As shown in FIG. 2, power plane 116 is coupled to contact 109a by a substrate-via 117b, and is further coupled to a junction 104 by a substrate-via 117a. Contact 109a provides an electrically conductive pathway between interconnect line 110b and substrate-via 117b.

Similarly, power plane 204 is coupled to a junction 104 by a substrate-via 206, and further coupled to a contact 109b by a substrate-via 210. Since power plane 116 is disposed between substrate 102 and power plane 204, it is necessary to provide an insulated opening through power plane 116 so that a substrate-via connection can be made from power plane 204. Such insulated openings in power plane 116 are shown at 208b and 212b in FIG. 2. Additionally, FIG. 2 shows insulating liners 208a and 212a in substrate-vias 206 and 210 respectively. In this way the conductive material of the substrate-via is electrically insulated from the substrate 102.

Substrate-vias 117b and 210 are shown in FIG. 2 as being wider in cross-section than contacts 109a and 109b respectively, however this is not a requirement of the present invention. The physical contact area required is determined as a function of the amount of resistance that can be tolerated by a particular circuit design. In other words, the cross-sectional area of the overlap between a substrate-via and a contact, determines the resistance of such a connection. The actual dimensions of the contact and substrate-via may be chosen arbitrarily.

Figure 3:
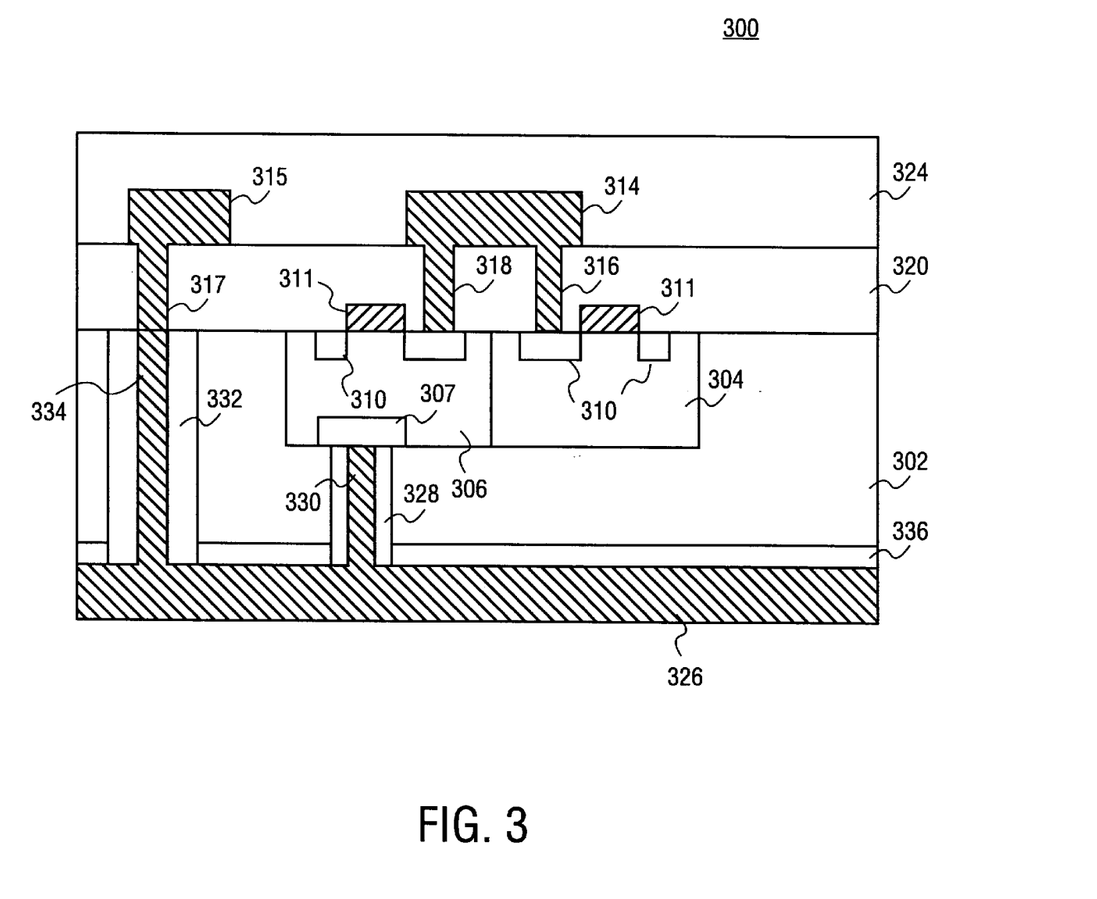
FIG. 3 is a schematic cross-sectional diagram of an integrated circuit showing a backside power plane, a substrate-via between the power plane and a well, and a substrate-via between the power plane and a front side interconnect line.

FIG. 3 is a schematic cross-sectional view of an integrated circuit 300 having a power distribution system in accordance with the present invention. As shown in FIG. 3, a power plane is disposed upon the backside of the integrated circuit and coupled to a well and a front side interconnect line through deep vias that are formed in the substrate.

As can be seen in FIG. 3, conventional structures are formed on a top surface of a substrate, such as a silicon wafer. These conventional structures include MOSFETs, interconnect lines, interlayer dielectrics, and contacts. More particularly, a conductive layer is disposed upon ILD 320 and patterned to form interconnect lines 314, 315. Contacts 316, 317, 318 are formed through ILD 320 so as to respectively provide electrically conductive pathways between interconnect lines 314, 315 and the surface of substrate 302.

FIG. 3 also shows a power plane and distribution network in accordance with the present invention. In the embodiment illustrated in FIG. 3, a p-type substrate 302 has an n-type layer 336 formed on the bottom, or backside, thereof. Methods for forming such an n-type layer include, but are not limited to ion implantation and thermal diffusion. A conductive layer 326 is disposed on the n-type backside. Conductive layer 326 is also referred to herein as a power plane when it is used to distribute power to the circuitry of the integrated circuit. Power plane 326 may be patterned or may be left unpatterned after it is deposited.

Substrate-vias 330 and 334 are formed through substrate 302, including the n-type layer formed on the backside of substrate 302, and provide electrically conductive pathways. Substrate-vias 330 and 334 have insulating liners 328 and 332 respectively. Insulating liners 328, 332 prevent the formation of a short circuit between substrate 302 and conductive layer 326. Substrate-via 330 provides an electrical connection between power plane 326 and buried well-tap 307 as shown in FIG. 3. Well tap 307 is a region of a well 306. Well-tap 307 is typically, but not required to be, disposed at the bottom of the well, i.e., that portion of the well that is furthest away from the front side surface of the substrate. Well tap 307 has a higher doping concentration than the rest of well 307, but has the same conductivity type impurity as the rest of well 307. Buried well taps may be formed by implanting from the backside through the substrate-via opening into a well. Those skilled in the art will understand that doping profiles are commonly customized by way of the adjustment of implant dose, energy, implant species, and substrate orientation. Alternatively, buried well taps may be formed from the front side by implanting to create the appropriate doping profile. Forming the well taps from the front side may provide the benefit of using the well tap as an etch stop layer for substrate-via openings that are being etched to form connections to those well taps. As is further shown in FIG. 3, substrate-via 334 provides an electrical connection between power plane 326 and contact 317, and thereby to interconnect line 315.

Figure 4:
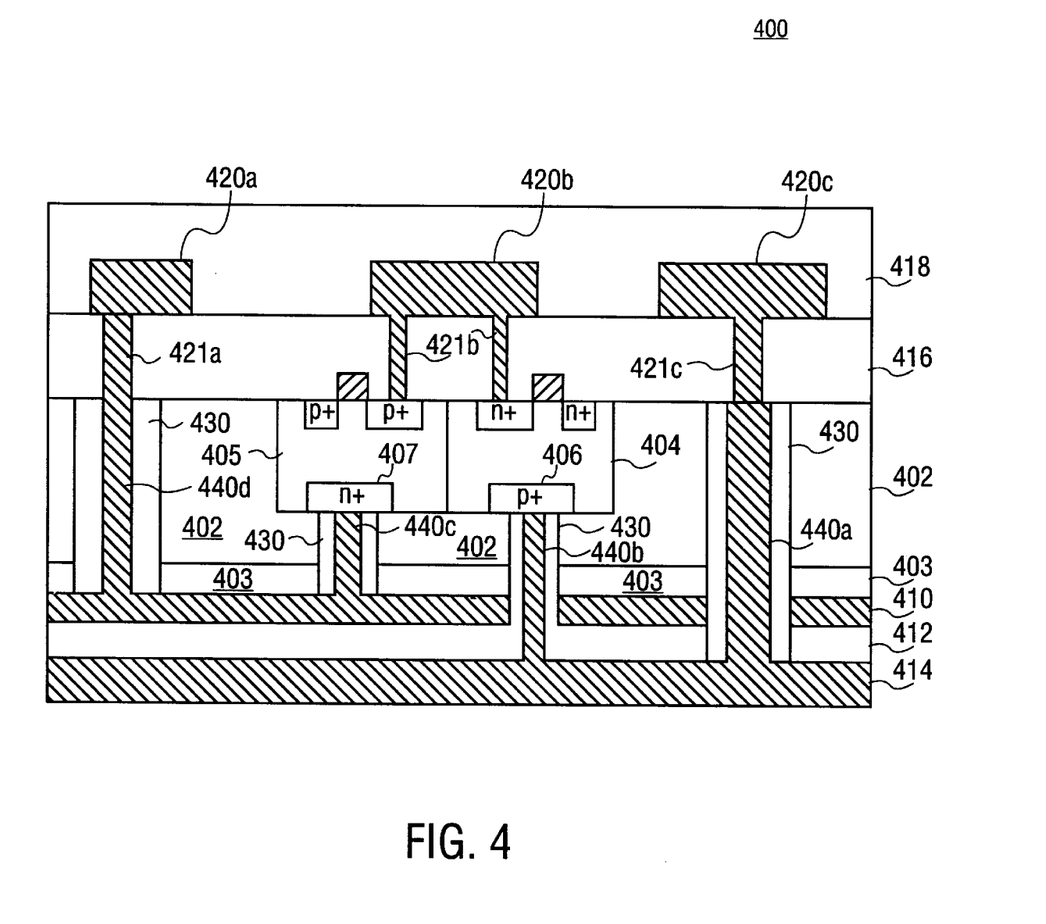
FIG. 4 is a schematic cross-sectional diagram of an integrated circuit showing a pair of backside power planes separated by a dielectric layer, substrate-vias between each of the power planes and a well, and substrate-vias between each of the power planes and front side interconnect lines.

FIG. 4 is a schematic cross-sectional view of an integrated circuit 400 similar to that shown in FIG. 3. Integrated circuit 400 includes a pair of power planes, separated by a dielectric layer, and disposed upon the backside of the integrated circuit. These stacked, backside power planes are coupled to wells and front side interconnect lines through deep vias that are formed in the substrate.

As can be seen in FIG. 4, conventional structures are formed on a top surface of a substrate, such as a silicon wafer. These conventional structures include MOSFETs, interconnect lines, interlayer dielectrics, and contacts. More particularly, a conductive layer is disposed upon ILD 416 and patterned to form interconnect lines 420a, 420b, and 420c. Contacts 421a, 421b, 421c are formed through ILD 416 so as to respectively provide electrically conductive pathways between interconnect lines 420a, 420b, 420c and the surface of substrate 402.

FIG. 4 also shows a pair of power planes and distribution network in accordance with the present invention. In the embodiment illustrated in FIG. 4, a p-type substrate 402 has an n-type layer 403 formed on the bottom, or backside, thereof. A first conductive layer 410 is disposed on the n-type backside. First conductive layer 410 is also referred to herein as a power plane when it is used to distribute power to the circuitry of integrated circuit 400. In the illustrated embodiment wherein there are two power planes, power plane 410 is patterned at least to the extent necessary to provide substrate-via openings for the second power plane. It will be recognized by those skilled in the art and having the benefit of this disclosure that additional substrate-via openings would need to be patterned in the case where additional power planes were stacked on the backside of integrated circuit 400. As shown, in FIG. 4, a second power plane 414 is disposed on the backside of integrated circuit 400 and separated from first power plane 410 by a dielectric layer 412.

Substrate-vias 440a, 440b, 440c and 440d are formed through substrate 402, including n-type layer 412, and provide electrically conductive pathways. Substrate-vias 440a, 440b, 440c and 440d have insulating liners 430. Insulating liners 430 prevent the formation of a short circuit between substrate 402 and power planes 410, 414. Substrate-via 440a provides an electrical connection between power plane 414 and contact 421c and thereby to interconnect line 420c as shown in FIG. 4. As is further shown in FIG. 4, substrate-via 440b provides an electrical connection between power plane 414 and well tap 406. Well tap 406 is a region of a well 404. Well tap 406 has a higher doping concentration than the rest of well 404, but has the same conductivity type impurity as the rest of well 404. Substrate-via 440c provides an electrical connection between power plane 410 and well tap 407. Well tap 407 is a region of a well 405. Well tap 407 has a higher doping concentration than the rest of well 405, but has the same conductivity type impurity as the rest of well 405. Substrate-via 440d provides an electrical connection between power plane 410 and contact 421a and thereby to interconnect line 420a as shown in FIG. 4

Method

Referring to FIGS. 5–8 an illustrative embodiment of the method of the present invention is described.

Figure 5:
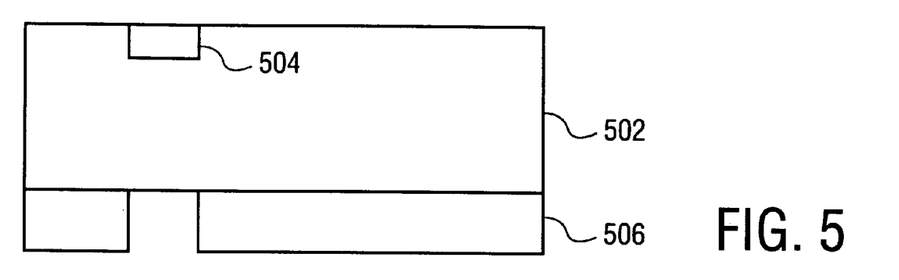
FIG. 5 is a schematic cross-sectional diagram of a wafer with a junction formed in a front side thereof and a patterned masking layer formed on the backside thereof.

An illustrative process embodying the present invention forms a substrate-via through the backside of a silicon substrate 502, such that a conductive pathway to a junction 504 is created. A masking layer 506 is deposited over the backside of substrate 502 and then patterned to define the location of the substrate-via. Masking layer 506 can be a silicon nitride layer, although any suitable masking material may be used to define the location of the substrate-via openings. After masking layer 506 is patterned, the substrate is exposed to an etchant to form a substrate-via opening 508. Since the thickness of substrate 502 is typically greater than 500 microns it is desirable to use a fast etch method to form the substrate-via openings. One suitable method for etching the substrate-via openings is a wet isotropic etching of silicon substrate 502 along the 111 planes using, for example, potassium hydroxide (KOH). Such a method of etching produces a tapered hole. Plasma etching could also be used, such as for example using an $SF_6$ etch chemistry in a reactive ion etcher (RIE) or an electron cyclotron resonance (ECR) etcher. Those skilled in the art will appreciate that any suitable deep via etching techniques may be applied.

Alternatively, the substrate may be thinned prior to the formation of the substrate-via openings. Thinning the substrate tends to reduce the aspect ratio of the substrate-vias. Such thinning may be accomplished by way of chemical mechanical polishing (CMP) or any other suitable technique as will be understood by those skilled in the art.

Figure 6:
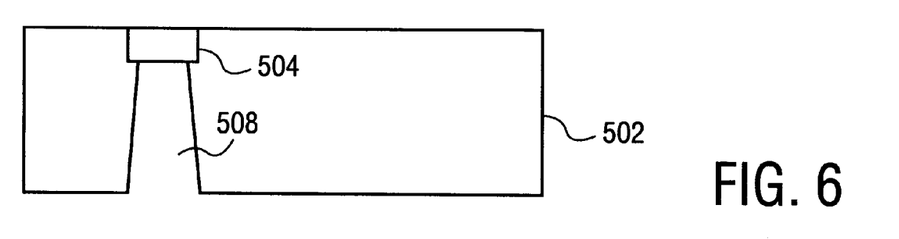
FIG. 6 is a schematic cross-sectional diagram of the wafer shown in FIG. 5 after a substrate-via has been etched and the masking layer removed.
Figure 7:
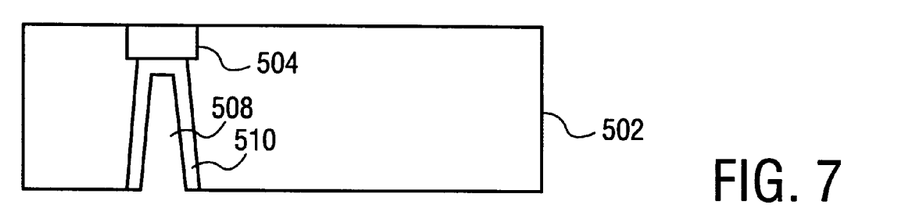
FIG. 7 is a schematic cross-sectional diagram of the wafer shown in FIG. 6 after an insulating liner has been formed.

After formation of substrate-via opening 508, masking layer 506 is removed, and a dielectric layer 510 is formed along the sidewalls of substrate-via opening 508. Dielectric layer 510 provides electrical insulation between the substrate and the electrically conductive material that will be placed into substrate-via opening 508 to complete the conductive pathway of the substrate-via. Dielectric layer 510 may also be referred to as a liner. Dielectric layer 510 may be formed by conventional techniques, including but not limited to such methods as chemical vapor deposition, and thermal oxidation.

Figure 8:
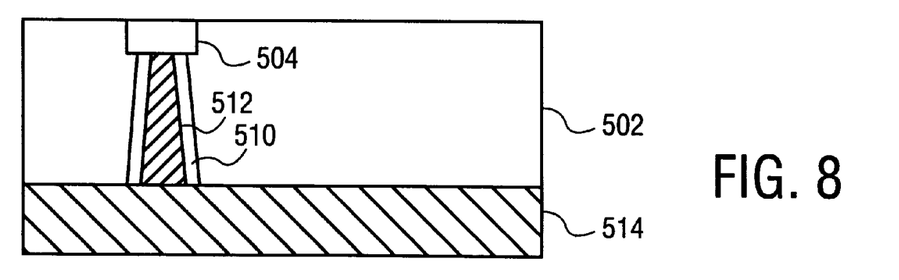
FIG. 8 is a schematic cross-sectional diagram of the wafer shown in FIG. 7 after an etch operation clears a vertical pathway through the substrate-via opening, the opening is substantially filled with a conductive material, and a power plane is formed on the backside.

Subsequent to the formation of dielectric layer 510, an etch operation may be performed to remove dielectric material from the bottom of substrate-via opening 508. In this way, electrically insulating material is removed from the physical pathway used by the substrate-via to provide an electrical connection. That is, a substantially vertical pathway is opened between the backside and the frontside of the substrate.

After formation of the substrate-via opening and dielectric coating of the substrate-via sidewalls, the opening is filled with a conductive material. A barrier layer, such as titanium nitride (not shown) may be applied to dielectric layer 510 to improve the adhesion between a conductive material and dielectric layer 510.

At this point in the process, a conductive plug 512 is typically formed in the substrate-via opening from a material such as tungsten. The substrate backside is then etched, for example, by a plasma etch, to remove excess plug and dielectric material from the substrate backside. A backside power plane 514 can then be formed by depositing a conductive layer, such as aluminum or an aluminum alloy, onto the backside of the substrate.

It will be appreciated that although the exemplary method described above produces a connection to a junction, that the invention is not so limited. Those skilled in the art, having the benefit of this disclosure, will recognize that substrate-vias may be used to provide connections to wells, to the substrate itself, as well as to conductive structures, including but not limited to contacts, on the front side of the substrate.

It will further be appreciated that the exact sequencing described herein is not required for embodiments of the present invention. The front side structures may be formed first and the backside structures may subsequently be formed. Alternatively, the backside structures may be formed first, followed by formation of front side structures. In a further alternative embodiment, the operations involved in forming the front side and backside structures may be interleaved, for example formation of the substrate-vias prior the frontside patterns, and concluding with the backside patterns.

Conclusion

Power planes are provided on the backside of a substrate and substrate-vias are formed to provide electrical connection between the backside power planes, and either front side circuit elements including but not limited to junctions and wells, front side interconnect lines, or both. Embodiments of the present invention reduce front side routing resource constraints by providing connections to the power supply nodes through the backside of an integrated circuit.

An advantage of providing power planes on the backside of an integrated circuit is that chip size can be reduced. Chip size reduction is possible for designs that are interconnect limited. That is, a chip having an area determined by the amount of its interconnect rather than the number of its transistors, is susceptible of area reduction by way of the present invention because the area that would have been consumed by power routing on the front side is now available for signal routing.

It will be understood by those skilled in the art and having the benefit of this disclosure, that many design choices are possible within the scope of the present invention. For example, both power and ground substrate-via openings may be insulated prior to being filled with a conductive material, or selective use of insulation in substrate-via openings may be used since, depending of the conductivity type of the substrate, it may be desirable to electrically couple the substrate to either power or ground. Additionally, the present invention is not limited to a specific conductive material for use in the substrate-vias.

It will be understood that various other changes in the details, materials, and arrangements of the parts and steps which have been described and illustrated may be made by those skilled in the art without departing from the principles and scope of the invention as expressed in the subjoined claims.

What is claimed is:

1. A structure, comprising:
   a substrate having a front side and a back side;
   a circuit on the front side of the substrate, the circuit comprising at least one conductive trace and a material disposed adjacent to the conductive trace, the material having a dielectric constant less than that of silicon dioxide;
   a first power plane on the back side of the substrate;
   a second power plane adjacent the first power plane and separated therefrom by a material having a dielectric constant greater than that of silicon dioxide; and
   at least one substrate-via, the at least one substrate-via electrically coupling the first power plane to the circuit;
   wherein the substrate comprises a p-type semiconductor wafer having an n-type doped layer at the back side thereof such that the n-type doped layer is in contact with the first power plane.

2. The structure of claim 1, further comprising at least one substrate-via that electrically couples the first power plane to an interconnect line on the front side of the substrate.

3. The structure of claim 1, further comprising at least one substrate-via that electrically couples the second power plane to an interconnect line on the front side of the substrate.

4. The structure of claim 1, further comprising at least one via that electrically couples the second power plane to a well, the well being disposed within the substrate.

5. The structure of claim 1, further comprising a first external connection point adjacent to the front side of the substrate, the first external connection point being electrically coupled to the first power plane.

6. The structure of claim 1, further comprising a second external connection point adjacent to the front side of the substrate, the second external connection point being electrically coupled to the second power plane.

7. A microelectronic structure, comprising:
   a silicon substrate having a front side and a back side, and a first well and a second well disposed in the front side of the substrate;
   a circuit disposed, at least in part, within the first and second wells the circuit including an interconnect line, the interconnect line having a material disposed adjacent thereto, the material having a dielectric constant less than that of silicon dioxide;
   a first power plane disposed on the back side of the substrate;
   a first insulator having a dielectric constant greater than or equal to that of silicon dioxide disposed over the first power plane;
   a second power plane disposed over the first insulator;
   a first substrate-via electrically coupling the first power plane to a well tap at the bottom of the circuit; and
   a second substrate-via electrically coupling the second power plane to the circuit.

8. The microelectronic structure of claim 7, further comprising a first external connection point coupled to the first power plane.

9. The microelectronic structure of claim 8, wherein the first external connection point is adjacent the front side of the substrate.

10. The microelectronic structure of claim 9, wherein the first external connection point is a solder bump.

11. The microelectronic structure of claim 8, further comprising a second external connection point coupled to the second power plane.

12. The microelectronic structure of claim 11, wherein the second external connection point is adjacent the front side of the substrate.

13. The microelectronic structure of claim 12, wherein the second external connection point is a solder bump.

14. The microelectronic structure of claim 11, wherein the second external connection point is adjacent the backside of the substrate.

15. An integrated circuit comprising:
   a substrate having a first side and a second side;
   an n well and a p well in said substrate first side;
   at least one electrical component on the first side;
   an interconnect line on the first side adjacent thereto at least one dielectric layer having a dielectric constant less than that of silicon dioxide;
   at least two power distribution conductors on the second side wherein one power distribution conductor directly contacts said substrate second side, the at least two power distribution conductors having an insulating layer disposed therebetween, the insulating layer having a dielectric constant equal to or greater than that of silicon dioxide; and
   a substrate-via coupled between the at least one electrical component and the at least one power distribution conductor.

16. The integrated circuit of claim 15, wherein the at least one electrical component comprises a plurality of interconnected transistors.

17. The integrated circuit of claim 15, wherein the substrate-via is isolated from the substrate by an electrically insulating liner.

18. A structure, comprising:
   a substrate having a front side and a back side;
   a circuit on the front side of the substrate, the circuit comprising at least one conductive trace and a material disposed adjacent to the conductive trace, the material having a dielectric constant less than that of silicon dioxide;

a first power plane on the back side of the substrate;

a second power plane adjacent the first power plane on the back side of the substrate and separated from the first power plane by a material having a dielectric constant greater than that of silicon dioxide;

a first substrate-via electrically coupling the first power plane to the circuit; and a second substrate-via electrically coupling the first power plane to a well tap formed at a bottom side of a well disposed within the substrate.

19. The structure of claim 18, wherein the substrate comprises a semiconductor wafer.

20. The structure of claim 18, wherein the first and second power planes comprise metal.

21. A structure, comprising:

a substrate having a front side and a back side;

a circuit on the front side of the substrate, the circuit comprising at least one interconnect line and an insulator disposed adjacent to the interconnect line, the insulator having a dielectric constant less than that of silicon dioxide;

a first power plane on the back side of the substrate;

a second power plane adjacent the first power plane on the back side of the substrate and separated from the first power plane by a material having a dielectric constant greater than that of silicon dioxide; and a first substrate-via electrically coupling the first power plane to a first well tap formed at a bottom side of a first well disposed within the substrate.

22. The structure of claim 21, further comprising a second substrate-via electrically coupling the second power plane to a second well tap formed at a bottom side of a second well disposed within the substrate.

23. A semiconductor device, comprising:

a p type semiconductor substrate having a front side and a back side;

a circuit disposed on the front side;

a first ground power plane disposed on, and in direct contact with the back side;

a first substrate-via disposed in the substrate, and in direct contact with the p type semiconductor substrate, the first ground power plane and an n type region in said p type semiconductor substrate;

a second vice power plane disposed adjacent the first power plane, and a dielectric layer disposed therebetween; and a second substrate-via disposed in the substrate and isolated therefrom by an insulating material disposed between the second substrate-via and the substrate.

24. The semiconductor device of claim 23, wherein the dielectric layer disposed between the first and second power planes has a dielectric constant greater than that of silicon dioxide; and wherein the circuit comprises conductive interconnect lines isolated each from the other by one or more dielectric materials having a dielectric constant less than that of silicon dioxide.

25. A semiconductor device, comprising:

a semiconductor substrate having a front side and a back side;

a circuit disposed on the front side;

a first power plane disposed on, and in direct contact with the back side;

a first substrate-via disposed in the substrate, and in direct contact with the semiconductor substrate, and the first power plane;

a second power plane disposed adjacent the first power plane, and a dielectric layer disposed therebetween; and a second substrate-via disposed in the substrate and isolated therefrom by an insulating material disposed between the second substrate-via and the substrate, a first well formed in said semiconductor substrate front side, said first well with a first well tap disposed in a bottom portion of the first well and a second well formed in said semiconductor substrate front side, said second well with a second well tap disposed in a bottom portion of the second well.

26. The semiconductor device of claim 25, wherein the first well tap is in electrical contact with at least one substrate-via.

27. The semiconductor device of claim 25, wherein the first well tap is in electrical contact with a first substrate-via which is electrically connected to the first power plane, and the second well tap is in electrical contact with a second substrate-via which is electrically connected to the second power plane.

* * * * *